United States Patent
Chen

(10) Patent No.: US 8,855,153 B2
(45) Date of Patent: Oct. 7, 2014

(54) LASER MACHINING CONTROL SYSTEM THROUGH FEEDBACK

(71) Applicant: Hon Hai Precision Industry Co., Ltd., New Taipei (TW)

(72) Inventor: Po-Chou Chen, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/727,636

(22) Filed: Dec. 27, 2012

(65) Prior Publication Data

US 2014/0126593 A1    May 8, 2014

(30) Foreign Application Priority Data

Nov. 8, 2012 (TW) ............... 101141682 A

(51) Int. Cl.
 *H01S 3/13* (2006.01)
 *H01S 3/02* (2006.01)

(52) U.S. Cl.
 CPC ....................................... *H01S 3/02* (2013.01)
 USPC ............ 372/29.011; 372/29.015; 372/29.021; 372/38.07; 372/99

(58) Field of Classification Search
 CPC ....... H01S 3/00; H01S 3/0007; H01S 3/0014; H01S 3/005; H01S 3/034; H01S 3/08; H01S 3/0912; H01S 3/102
 USPC ................ 372/29.011, 29.015, 29.021, 38.07
 See application file for complete search history.

(56) References Cited

U.S. PATENT DOCUMENTS

2002/0136120 A1*  9/2002 Kurebayashi et al. ..... 369/47.51
2013/0131671 A1*  5/2013 Baker, Jr. ...................... 606/41

* cited by examiner

*Primary Examiner* — Dung Nguyen
(74) *Attorney, Agent, or Firm* — Novak Druce Connolly Bove + Quigg LLP

(57) ABSTRACT

A laser machining control system includes a laser diode, a laser power controller connected to the laser diode, a light transmission-reflection element positioned on a light path of a laser light beam to a workpiece, and an output power meter. The output power meter detects the laser light beam being reflected by the transmission-reflection element and measures an output power of the laser diode. The output power meter gives a signal to the laser power controller if there is a power loss of the laser light beam, and the laser power controller adjusts the voltage and the current input to the laser diode in compensation.

24 Claims, 1 Drawing Sheet

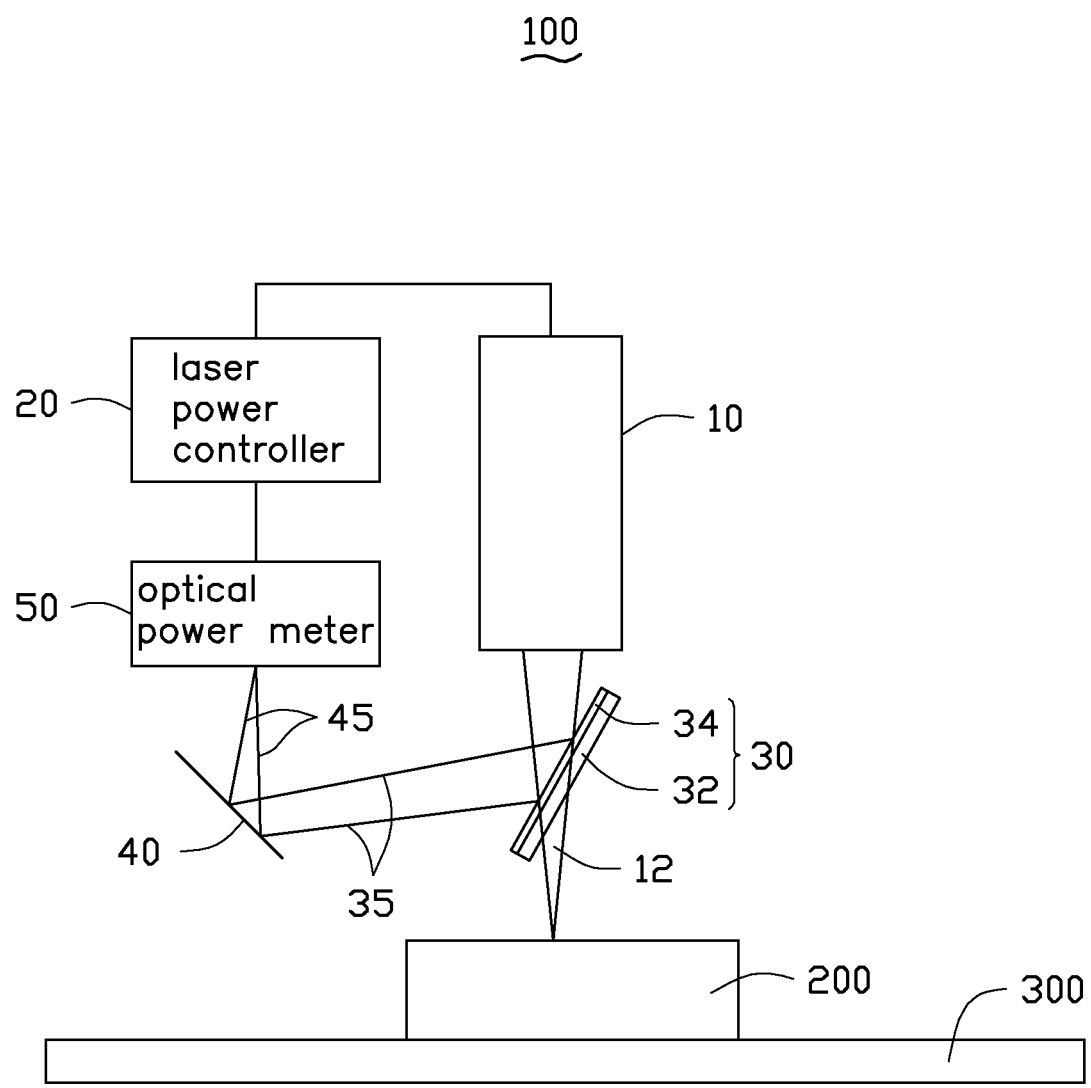

LASER MACHINING CONTROL SYSTEM THROUGH FEEDBACK

BACKGROUND

1. Technical Field

The present disclosure relates to laser machining systems, and particularly to a laser machining control system through feedback.

2. Description of Related Art

Laser is frequently used in machining workpieces, such as shaping mold blocks. In laser machining, a stable output power of a laser diode is required. However, sometimes there is a power loss of a laser light beam emitted from the laser diode, therefore a machining depth in the workpiece may not be uniform.

What is needed, therefore, is a laser machining control system, which can overcome the above shortcomings.

BRIEF DESCRIPTION OF THE DRAWINGS

Many aspects of the laser machining control system can be better understood with reference to the drawing. The components in the drawing are not necessarily drawn to scale, the emphasis instead being placed upon clearly illustrating the principles of the present laser machining control system.

The drawing is a schematic view of a laser machining control system in accordance with a first embodiment.

DETAILED DESCRIPTION

Embodiments of the present laser machining control system will be described with reference to the drawing.

Referring to the drawing, a laser machining control system 100 includes a laser diode 10, a laser power controller 20 connected to the laser diode 10, a transmission-reflection element 30, a reflection element 40 and an output power meter 50.

The laser diode 10 emits a laser light beam 12 which is strong enough to cut and shape materials. In the present embodiment, the workpiece to be machined is a mold core, the laser light beam 12 emitted from the laser diode 10 is a converged light beam, and a wavelength of the laser light beam 12 is about 1035 nm. The laser power controller 20 is a circuit device which controls voltage and current input to the laser diode 10, enabling the output power of the laser diode 10 to be kept at a certain predetermined level.

The light transmission-reflection element 30 is positioned in the light path of the laser light beam 12 to the workpiece 200, and is slanted relative to the light path. A part of the laser light beam 12 is transmitted through the light transmission-reflection element 30, and another part is reflected by the light transmission-reflection element 30.

The light transmission-reflection element 30 may have a transparent glass substrate 32, and a reflecting layer 34 formed on a surface of the glass substrate 32 facing toward the laser diode 10. The glass substrate 32 has a high transmission factor for the laser light beam 12. The reflecting layer 34 has a predetermined reflection ratio (percentage) and a predetermined transmission ratio in relation to the laser light beam 12. The reflection ratio and the transmission ratio of the reflecting layer 34 can be determined by the material used and the thickness of the reflecting layer 34. In the present embodiment, the preferred reflection ratio is not greater than 5%, and the preferred transmission ratio is not less than 95%.

In order to achieve such a low reflection ratio and a high transmission ratio, the reflecting layer 34 may be made of a nano-particle material, and a thickness of the reflecting layer 34 is not to be greater than 0.05 mm. The nano-particles have a small surface area, thus reducing light reflection and increasing light transmission. In particular, the reflecting layer 34 is composed of a plurality of high refractive layers and a plurality of low refractive layers alternately stacked one on another. Each of the high refractive layers may include a material selected from a group consisting of nano-$TiO_2$, nano-$Ti_3O_5$ and nano-$Ta_2O_5$, and each of the low refractive layers may include a material selected from nano-$SiO_2$ and nano-$MgF_2$. A thickness of each of the multi-layers is in range from $10^{-6}$ mm to $10^{-4}$ mm, and a total thickness of the reflecting layer 34 is not greater than 0.05 mm.

The reflection element 40 reflects light 35 reflected by the light transmission-reflection element 30, and the reflection ratio should be total if possible.

The output power meter 50 receives the light 45 reflected by the reflection element 40, and detects the power of the light 45, thereby determining any power loss of the laser light beam 12. In particular, the output power meter 50 includes a light sensor for sensing light intensity, an amplifier for amplifying and measuring the output power of the light, and a display for displaying the sensed power.

The output power meter 50 gives a signal to the laser power controller 20 if there is a power loss of the laser light beam 12, then the laser power controller 20 adjusts voltage and current input to the laser diode 10 based on the signal from the output power meter 50. In this way, if there is a power loss, the power of the laser light beam 12 can be compensated as required, such that the output power of the laser diode 10 can be maintained at a predetermined level.

In the present embodiment, the light 35 reflected from the light transmission-reflection element 30 occupies only a small section of the laser light beam 12, and a ratio of the reflection part and the transmission part is fixed, such that the machining operation carried out by the laser is not influenced by the light reflection, and a machining depth in the workpiece 200 is still uniform.

A width of a surface of the light transmission-reflection element 30 is greater than a width of a light spot of the laser light beam 12 projected on the light transmission-reflection element 30 to allow the laser light beam 12 transmit through the light transmission-reflection element 30 to reach the workpiece 200. The platform 300 on which the workpiece 200 is positioned is movable, thereby facilitating machining different positions of the workpiece 200.

In other embodiments, the reflection element 40 can be omitted, and the output power meter 50 can receive the light 35 directly reflected by light transmission-reflection element 30.

The above-described embodiments are intended to illustrate rather than limit the disclosure. Variations may be made to the embodiments and methods without departing from the spirit of the disclosure. Accordingly, it is appropriate that the appended claims be construed broadly and in a manner consistent with the scope of the disclosure.

What is claimed is:

1. A laser machining control system, comprising:
   a laser diode for emitting a laser light beam;
   a laser power controller connected to the laser diode and configured to control a voltage and a current input to the laser diode, thereby controlling an output power of the laser diode;
   a light transmission-reflection element positioned on a light path of the laser light beam to a workpiece, the light transmission-reflection element configured to allow a part of the laser light beam to transmit therethrough to reach the workpiece, and reflect the other part of the laser light beam;

an output power meter configured to detect the reflected part of the laser light beam and measure an output power of the laser diode according to the detected reflected laser light beam, the laser power controller configured for adjusting the voltage and the current input to the laser diode according to the output power measured by the output power meter, thereby maintaining output power of the laser diode at a predetermined level; and a reflection element configured to reflect the other part of the laser light beam reflected by the light transmission-reflection element to the output power meter.

2. The laser machining control system of claim 1, wherein a transmission percentage of the part of the laser light beam which transmits through the transmission-reflection element is not less than 95%, and a reflection percentage of the other part of the laser light beam which is reflected by the light transmission-reflection element is not greater than 5%.

3. The laser machining control system of claim 1, wherein the light transmission-reflection element is slanted relative to the light path of the laser light beam to the workpiece.

4. The laser machining control system of claim 1, wherein the light transmission-reflection element comprises a transparent glass substrate and a reflecting film formed on a surface of the glass substrate facing toward the laser diode.

5. The laser machining control system of claim 4, wherein the reflecting film is made of nano-particles.

6. The laser machining control system of claim 5, wherein the reflecting film is composed of a plurality of high refractive layers and a plurality of low refractive layers alternately stacked one on another, each of the high refractive layers comprising a material selected from a group consisting of nano-$TiO_2$, nano-$Ti_3O_5$ and nano-$Ta_2O_5$, and each of the low refractive layers comprising a material selected from nano-$SiO_2$ and nano-$MgF_2$.

7. The laser machining control system of claim 6, wherein a thickness of each of the high and low refractive layers is in range from $10^{-6}$ mm to $10^{-4}$ mm, and a total thickness of the reflecting film is not greater than 0.05 mm.

8. The laser machining control system of claim 1, wherein a wavelength of the laser light beam is about 1035 nm.

9. The laser machining control system of claim 1, wherein the laser light beam emitted from the laser diode is a converged light beam.

10. A laser machining control system, comprising:
a laser diode for emitting a laser light beam;
a laser power controller connected to the laser diode and configured to control a voltage and a current input to the laser diode, thereby controlling an output power of the laser diode;
a light transmission-reflection element positioned on a light path of the laser light beam to a workpiece, the light transmission-reflection element configured to allow a part of the laser light beam to transmit therethrough to reach the workpiece, and reflect the other part of the laser light beam, a transmission percentage of the part of the laser light beam which transmits through the transmission-reflection element being not less than 95%, and a reflection percentage of the other part of the laser light beam which is reflected by the light transmission-reflection element being not greater than 5%; and
an output power meter configured to detect the reflected part of the laser light beam and measure an output power of the laser diode according to the detected reflected laser light beam, the laser power controller configured for adjusting the voltage and the current input to the laser diode according to the output power measured by the output power meter, thereby maintaining output power of the laser diode at a predetermined level.

11. The laser machining control system of claim 10, wherein the light transmission-reflection element is slanted relative to the light path of the laser light beam to the workpiece.

12. The laser machining control system of claim 10, wherein the light transmission-reflection element comprises a transparent glass substrate and a reflecting film formed on a surface of the glass substrate facing toward the laser diode.

13. The laser machining control system of claim 12, wherein the reflecting film is made of nano-particles.

14. The laser machining control system of claim 13, wherein the reflecting film is composed of a plurality of high refractive layers and a plurality of low refractive layers alternately stacked one on another, each of the high refractive layers comprising a material selected from a group consisting of nano-$TiO_2$, nano-$Ti_3O_5$, and nano-$Ta_2O_5$, and each of the low refractive layers comprising a material selected from nano-$SiO_2$ and nano-$MgF_2$.

15. The laser machining control system of claim 14, wherein a thickness of each of the high and low refractive layers is in range from $10^{-6}$ mm to $10^{-4}$ mm, and a total thickness of the reflecting film is not greater than 0.05 mm.

16. The laser machining control system of claim 10, wherein a wavelength of the laser light beam is about 1035 nm.

17. The laser machining control system of claim 10, wherein the laser light beam emitted from the laser diode is a converged light beam.

18. A laser machining control system, comprising:
a laser diode for emitting a laser light beam;
a laser power controller connected to the laser diode and configured to control a voltage and a current input to the laser diode, thereby controlling an output power of the laser diode;
a light transmission-reflection element positioned on a light path of the laser light beam to a workpiece, the light transmission-reflection element configured to allow a part of the laser light beam to transmit therethrough to reach the workpiece, and reflect the other part of the laser light beam, the light transmission-reflection element comprising a transparent glass substrate and a reflecting film formed on a surface of the glass substrate facing toward the laser diode; and
an output power meter configured to detect the reflected part of the laser light beam and measure an output power of the laser diode according to the detected reflected laser light beam, the laser power controller configured for adjusting the voltage and the current input to the laser diode according to the output power measured by the output power meter, thereby maintaining output power of the laser diode at a predetermined level.

19. The laser machining control system of claim 18, wherein the light transmission-reflection element is slanted relative to the light path of the laser light beam to the workpiece.

20. The laser machining control system of claim 18, wherein the reflecting film is made of nano-particles.

21. The laser machining control system of claim 20, wherein the reflecting film is composed of a plurality of high refractive layers and a plurality of low refractive layers alternately stacked one on another, each of the high refractive layers comprising a material selected from a group consisting of nano-$TiO_2$, nano-$Ti_3O_5$, and nano-$Ta_2O_5$, and each of the low refractive layers comprising a material selected from nano-$SiO_2$ and nano-$MgF_2$.

22. The laser machining control system of claim 21, wherein a thickness of of the high and low refractive layers is in range from $10^{-6}$ mm to $10^{-4}$ mm, and a total thickness of the reflecting film is not greater than 0.05 mm.

23. The laser machining control system of claim 18, wherein a wavelength of the laser light beam is about 1035 nm.

24. The laser machining control system of claim 18, wherein the laser light beam emitted from the laser diode is a converged light beam.

* * * * *